(12) United States Patent
Lee

(10) Patent No.: US 9,203,390 B1
(45) Date of Patent: Dec. 1, 2015

(54) FUNCTIONAL DEVICE AND TEST MODE ACTIVATION CIRCUIT OF THE SAME

(71) Applicant: Himax Analogic, Inc., Tainan (TW)

(72) Inventor: Chow-Peng Lee, Tainan (TW)

(73) Assignee: HIMAX ANALOGIC, INC., Tainan (TW)

( * ) Notice: Subject to any disclaimer, the term of this patent is extended or adjusted under 35 U.S.C. 154(b) by 0 days.

(21) Appl. No.: 14/461,176

(22) Filed: Aug. 15, 2014

(51) Int. Cl.
*H03K 5/153* (2006.01)
*H03K 5/24* (2006.01)
*H03K 3/013* (2006.01)

(52) U.S. Cl.
CPC . *H03K 5/24* (2013.01); *H03K 3/013* (2013.01)

(58) Field of Classification Search
CPC ....... H03K 5/2481; H03K 5/249; H03K 5/08; H03K 5/24; G01R 19/16519
USPC .............................. 327/77, 78, 142, 143, 198
See application file for complete search history.

(56) References Cited

U.S. PATENT DOCUMENTS

| | | | |
|---|---|---|---|
| 2005/0007472 A1* | 1/2005 | Koch | 348/302 |
| 2006/0126238 A1* | 6/2006 | Goudo | 361/56 |
| 2006/0279308 A1 | 12/2006 | Ong | |
| 2014/0035688 A1* | 2/2014 | Ko | 331/111 |

FOREIGN PATENT DOCUMENTS

| | | |
|---|---|---|
| JP | 2012112788 A | 6/2012 |
| TW | 306627 | 5/1997 |
| TW | 1357710 B | 2/2012 |
| TW | 1427301 B | 2/2014 |

\* cited by examiner

*Primary Examiner* — Quan Tra
(74) *Attorney, Agent, or Firm* — Locke Lord LLP; Tim Tingkang Xia, Esq.

(57) ABSTRACT

A test mode activation circuit that includes a clock signal generating module, a resistor-capacitor circuit, a current generating module, an output capacitor and a comparator is provided. The clock signal generating module generates a clock signal to an input node such that the resistor-capacitor circuit electrically connected to the input node receives the clock signal to generate a triggering signal every predetermined time interval. The current generating module generates a charging current to an output node in response to the triggering signal. The output capacitor receives the charging current from the output node such that an output voltage of the output node gradually increases. The comparator receives the output voltage from the output node and a reference voltage, wherein the comparator compares the output voltage and the reference voltage to generate a test mode activation signal when the output voltage is larger than the reference voltage.

12 Claims, 2 Drawing Sheets

FUNCTIONAL DEVICE AND TEST MODE ACTIVATION CIRCUIT OF THE SAME

BACKGROUND

1. Field of Invention

The present invention relates to an electronic circuit. More particularly, the present invention relates to a functional device and a test mode activation circuit of the same.

2. Description of Related Art

Typically, a semiconductor integrated circuit (IC) device incorporates a test mode activation circuit for generating a test mode activation signal. The test mode activation signal puts the IC device in a test mode for testing functional circuits in the IC device. In a conventional design, the test mode activation signal is a control voltage higher or lower than a predetermined level. Once the IC device detects the control voltage, the IC device switches from the operation mode to the test mode.

However, the IC device may be accidentally put in the test mode by a noise signal, such as a ground noise applied to the input of the test mode activation signal. On the other hand, if the voltage level of the control voltage is higher than the highest tolerable voltage of the components in the IC device, the components in the IC device may be damaged.

Accordingly, what is needed is a functional device and a test mode activation circuit of the same to address the issues mentioned above.

SUMMARY

An aspect of the present invention is to provide a test mode activation circuit. The test mode activation circuit includes a clock signal generating module, a resistor-capacitor (RC) circuit, a current generating module, an output capacitor and a comparator. The clock signal generating module generates a clock signal to an input node. The resistor-capacitor circuit is electrically connected to the input node to receive the clock signal to generate a triggering signal every predetermined time interval. The current generating module generates a charging current to an output node in response to the triggering signal. The output capacitor is electrically connected to the output node to receive the charging current such that an output voltage of the output node gradually increases. The comparator is electrically connected to the output node to receive the output voltage and a reference voltage, wherein the comparator compares the output voltage and the reference voltage to generate a test mode activation signal when the output voltage is larger than the reference voltage.

Another aspect of the present invention is to provide a functional device. The functional device includes a functional circuit and a test mode activation circuit. The test mode activation circuit includes a clock signal generating module, a resistor-capacitor circuit, a current generating module, an output capacitor and a comparator. The clock signal generating module generates a clock signal to an input node. The resistor-capacitor circuit is electrically connected to the input node to receive the clock signal to generate a triggering signal every predetermined time interval. The current generating module generates a charging current to an output node in response to the triggering signal. The output capacitor is electrically connected to the output node to receive the charging current such that an output voltage of the output node gradually increases. The comparator is electrically connected to the output node to receive the output voltage and a reference voltage, wherein the comparator compares the output voltage and the reference voltage to generate a test mode activation signal when the output voltage is larger than the reference voltage such that the functional circuit switches from an operation mode and a test mode.

Yet another aspect of the present invention is to provide a test mode activation method used in a functional device that includes a functional circuit and a test mode activation circuit. The test mode activation method includes the steps outlined below. A clock signal is generated by a clock signal generating module of the test mode activation circuit to an input node. The clock signal is received by a resistor-capacitor circuit of the test mode activation circuit that is electrically connected to the input node to generate a triggering signal every predetermined time interval. A charging current is generated by a current generating module of the test mode activation circuit to an output node in response to the triggering signal. The charging current is received by an output capacitor of the test mode activation circuit that is electrically connected to the output node such that an output voltage of the output node gradually increases. The output voltage and a reference voltage are received by a comparator of the test mode activation circuit that is electrically connected to the output node. The output voltage and the reference voltage are compared by the comparator. A test mode activation signal is generated by the comparator to the functional circuit when the output voltage is larger than the reference voltage such that the functional circuit switches from an operation mode and a test mode.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
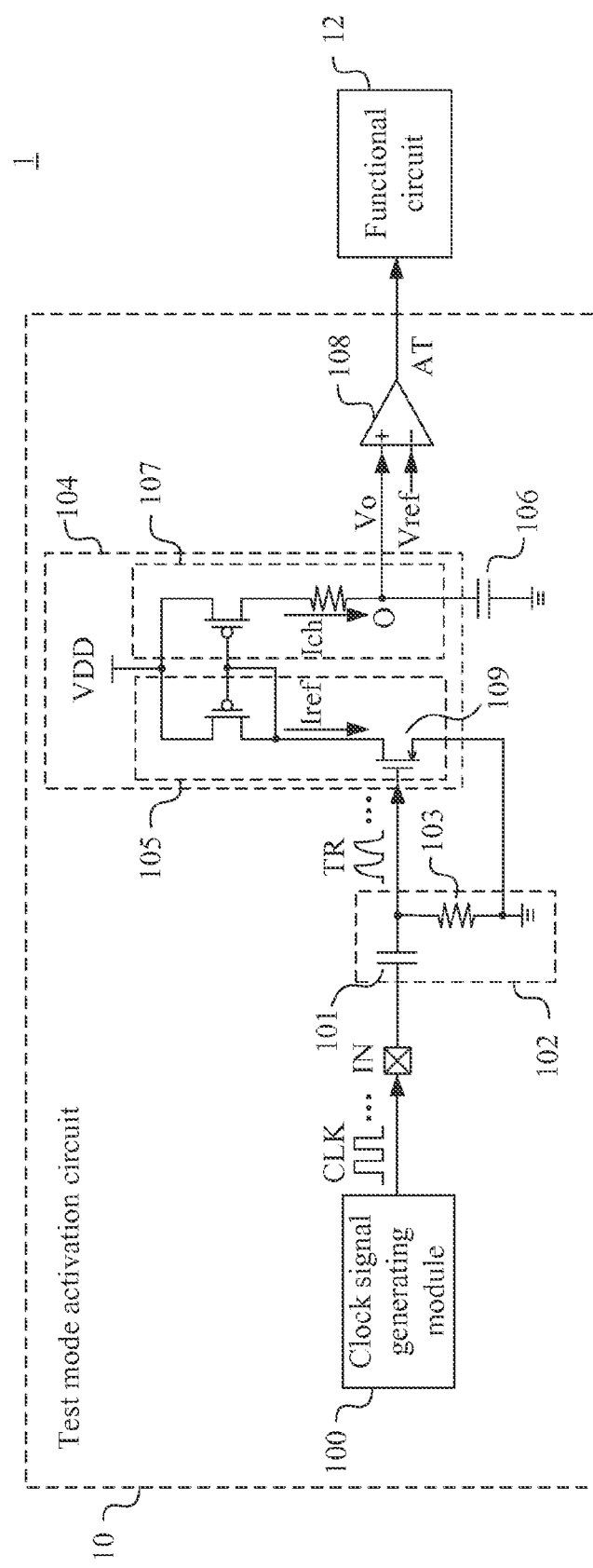
FIG. 1 is a circuit diagram of a functional device in an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a circuit diagram of a functional device 1 in an embodiment of the present invention. The functional device 1 includes a test mode activation circuit 10 and a functional circuit 12.

In different embodiments, the functional circuit 12 can be any circuit for performing a specific function. The functional circuit 12 is operated either in an operation mode and a test mode, in which the test mode activation circuit 10 is able to generate a test mode activation signal AT to the functional circuit 12 to switch the functional circuit 12 from the operation mode to the test mode.

The test mode activation circuit 10 includes a clock signal generating module 100, a resistor-capacitor (RC) circuit 102, a current generating module 104, an output capacitor 106 and a comparator 108.

The clock signal generating module 100 generates a clock signal CLK to an input node IN. In an embodiment, the input node IN is a pin available in the functional circuit 12.

The resistor-capacitor circuit 102 is electrically connected to the input node IN. In the present embodiment, the resistor-capacitor circuit 102 includes a capacitor 101 and a resistor 103.

A first terminal of the capacitor 101 is electrically connected to the input node IN to receive the clock signal CLK. A second terminal of the capacitor 101 is electrically connected to the current generating module 104. The resistor 103 is electrically connected between the second terminal of the capacitor 101 and a ground terminal GND.

The resistor-capacitor circuit 102 receives the clock signal CLK to generate a triggering signal TR every predetermined time interval. In an embodiment, the predetermined time interval is substantially the same as the period of the clock signal CLK. The resistor-capacitor circuit 102 is able to filter the direct current signal from the input node IN such that the resistor-capacitor circuit 102 only generates the triggering signal TR in response to the alternating clock signal CLK. More specifically, the resistor-capacitor circuit 102 will not generate the triggering signal TR due to any direct current signal noise or ground noise. In an embodiment, the triggering signal TR is a transient impulse signal.

In the present embodiment, the current generating current 104 includes a current mirror that includes a reference path 105 and an output path 107 electrically connected to an output node O.

The reference path 105 includes a triggering transistor 109 electrically connected to the resistor-capacitor circuit 102 to receive the triggering signal TR. The triggering transistor 109 is conducted in response to the triggering signal TR such that the current mirror is activated. Once the current mirror is activated, a reference current Iref is generated in the reference path 105 and a charging current Ich is generated at the output path 107. Accordingly, the charging current Ich is generated to the output node O.

The output capacitor 106 is electrically connected to the output node O to receive the charging current Ich therefrom such that an output voltage Vo of the output node O gradually increases. In an embodiment, the output voltage Vo increases in a stepwise manner since the current mirror is activated by the triggering transistor 109 that is conducted in response to the triggering signal TR every predetermined time interval.

The comparator 108 is electrically connected to the output node O to receive the output voltage Vo and a reference voltage Vref. The comparator 108 compares the output voltage Vo and the reference voltage Vref. When the output voltage Vo is larger than the reference voltage Vref, the comparator 108 generates a test mode activation signal AT to the functional circuit 12 such that the functional circuit 12 switches from the operation mode and the test mode.

As a result, in the functional device 1 of the present invention, the test mode activation circuit 10 can activate the test mode of the functional circuit 12 only when the clock signal CLK is generated to prevent the test mode of the functional circuit 12 from being activated by the direct current noise or the ground noise.

Figure 2:
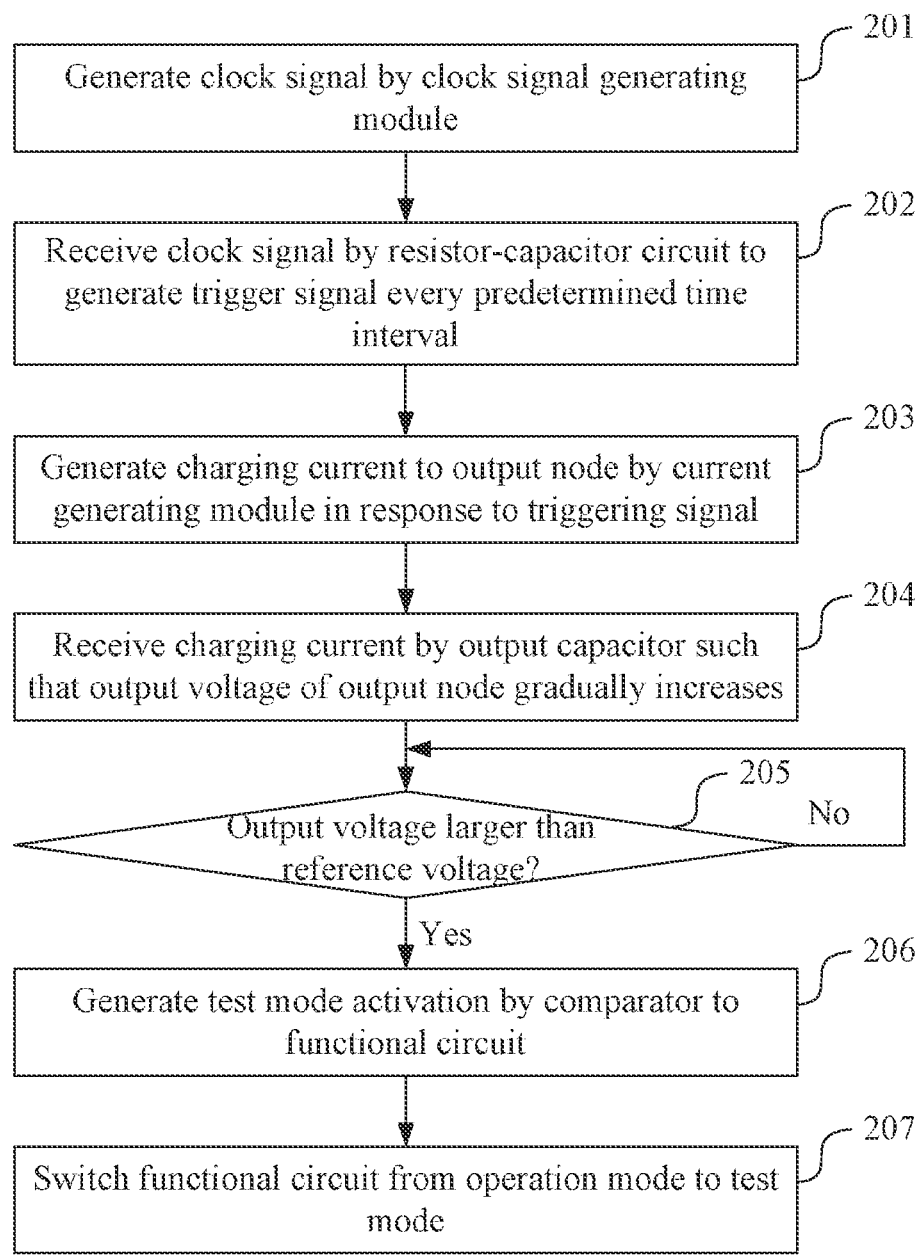
FIG. 2 is a flow chart of a test mode activation method in an embodiment of the present invention.

FIG. 2 is a flow chart of a test mode activation method 200 in an embodiment of the present invention. The test mode activation method 200 is used in the functional device 1 illustrated in FIG. 1, especially the test mode activation circuit 10 in the functional device 1. The test mode activation method 200 includes the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 201, the clock signal CLK is generated by the clock signal generating module 100 to the input node IN.

In step 202, the clock signal CLK is received by the resistor-capacitor circuit 102 to generate the triggering signal TR every predetermined time interval.

In step 203, the charging current Ich is generated by the current generating module 104 to an output node O in response to the triggering signal TR.

In step 204, the charging current Ich is received by the output capacitor 106 such that the output voltage Vo of the output node O gradually increases.

In step 205, the output voltage Vo and the reference voltage Vref are received by the comparator 108 such that the output voltage Vo and the reference voltage Vref are compared by the comparator 108 to determine whether the output voltage Vo is larger than the reference voltage Vref.

When the output voltage Vo is not larger than the reference voltage Vref, the flow goes back to step 205 to keep comparing the output voltage Vo and the reference voltage Vref. On the other hand, when the output voltage Vo is larger than the reference voltage Vref, the test mode activation signal AT is generated by the comparator 108 to the functional circuit 12 in step 206.

Subsequently, in step 207, the functional circuit 12 switches from the operation mode and the test mode.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A test mode activation circuit comprising:
   a clock signal generating module to generate a clock signal to an input node;
   a resistor-capacitor (RC) circuit electrically connected to the input node to receive the clock signal to generate a triggering signal every predetermined time interval;
   a current generating module to generate a charging current to an output node in response to the triggering signal;
   an output capacitor electrically connected to the output node to receive the charging current such that an output voltage of the output node gradually increases; and
   a comparator electrically connected to the output node to receive the output voltage and a reference voltage, wherein the comparator compares the output voltage and the reference voltage to generate a test mode activation signal when the output voltage is larger than the reference voltage.

2. The test mode activation circuit of claim 1, wherein the resistor-capacitor circuit comprises:
   a capacitor having a first terminal electrically connected to the clock signal generating module to receive the clock signal and a second terminal connected to the current generating module; and
   a resistor electrically connected between the second terminal of the capacitor and a ground terminal.

3. The test mode activation circuit of claim 1, wherein the current generating module comprises a current mirror that further comprises a reference path comprising a triggering transistor and an output path electrically connected to the output node, wherein the triggering transistor is electrically connected to the resistor-capacitor circuit to be conducted in response to the triggering signal to activate the current mirror to generate a reference current in the reference path and generate the charging current in the output path.

4. The test mode activation circuit of claim 1, wherein the input node is pin available in a functional circuit of a functional device.

5. The test mode activation circuit of claim 1, wherein the test mode activation signal switches the functional circuit from an operation mode to a test mode.

6. A functional device comprising:
a functional circuit; and
a test mode activation circuit comprising:
a clock signal generating module to generate a clock signal to an input node;
a resistor-capacitor circuit electrically connected to the input node to receive the clock signal to generate a triggering signal every predetermined time interval;
a current generating module to generate a charging current to an output node in response to the triggering signal;
an output capacitor electrically connected to the output node to receive the charging current such that an output voltage of the output node gradually increases; and
a comparator electrically connected to the output node to receive the output voltage and a reference voltage, wherein the comparator compares the output voltage and the reference voltage to generate a test mode activation signal to the functional circuit when the output voltage is larger than the reference voltage such that the functional circuit switches from an operation mode and a test mode.

7. The functional device of claim 6, wherein the resistor-capacitor circuit comprises:
a capacitor having a first terminal electrically connected to the clock signal generating module to receive the clock signal and a second terminal connected to the current generating module; and
a resistor electrically connected between the second terminal of the capacitor and a ground terminal.

8. The functional device of claim 6, wherein the current generating module comprises a current mirror that further comprises a reference path comprising a triggering transistor and an output path electrically connected to the output node, wherein the triggering transistor is electrically connected to the resistor-capacitor circuit to be conducted in response to the triggering signal to activate the current mirror to generate a reference current in the reference path and generate the charging current in the output path.

9. The functional device of claim 6, wherein the input node is a pin available in the functional circuit.

10. A test mode activation method used in a functional device that comprises a functional circuit and a test mode activation circuit, wherein the test mode activation method comprises:
generating a clock signal by a clock signal generating module of the test mode activation circuit to an input node;
receiving the clock signal by a resistor-capacitor circuit of the test mode activation circuit that is electrically connected to the input node to generate a triggering signal every predetermined time interval;
generating a charging current by a current generating module of the test mode activation circuit to an output node in response to the triggering signal;
receiving the charging current by an output capacitor of the test mode activation circuit that is electrically connected to the output node such that an output voltage of the output node gradually increases;
receiving the output voltage and a reference voltage by a comparator of the test mode activation circuit that is electrically connected to the output node;
comparing the output voltage and the reference voltage by the comparator; and
generating a test mode activation signal by the comparator to the functional circuit when the output voltage is larger than the reference voltage such that the functional circuit switches from an operation mode and a test mode.

11. The test mode activation method of claim 10, wherein the current generating module comprises a current mirror, and the current mirror further comprises a reference path comprising a triggering transistor that is electrically connected to the resistor-capacitor circuit and an output path electrically connected to the output node, and the test mode activation method further comprises:
conducting the triggering transistor in response to the triggering signal to activate the current mirror;
generating a reference current in the reference path and generating the charging current in the output path.

12. The test mode activation method of claim 10, wherein the clock signal is generated by the clock signal generating module until the output voltage is larger than the reference voltage.

* * * * *